United States Patent [19]

Gosser

[11] Patent Number: 5,150,074
[45] Date of Patent: Sep. 22, 1992

[54] WIDE-BAND TRANSCONDUCTANCE GENERATOR

[75] Inventor: Royal A. Gosser, Reidsville, N.C.

[73] Assignee: Analog Devices, Inc., Norwood, Mass.

[21] Appl. No.: 695,270

[22] Filed: May 3, 1991

[51] Int. Cl.[5] .............................................. H03F 1/26
[52] U.S. Cl. .................................... 330/263; 330/255; 330/265
[58] Field of Search ............... 330/255, 263, 265, 267, 330/268

[56] References Cited

U.S. PATENT DOCUMENTS 4,595,883  6/1986  Nakayama ..................... 330/268 X
4,970,470  11/1990  Gosser ............................ 330/255 X Primary Examiner—Steven Mottola
Attorney, Agent, or Firm—Parmelee, Bollinger & Bramblett

[57] ABSTRACT

A transconductance generator including a cross-coupled quad circuit having first and second pairs of complementary transistors, wherein one of the first pair is in series with a complementary one of the second pair, and the other two transistors also are in series. Two input terminals are provided, one for each pair of cross-quad transistors. Two current mirrors are provided, one being coupled to a set of two NPN cross-quad transistors, and the other coupled to the two PNP cross-quad transistors. The cross-quad circuit and the current mirrors provide an output signal through a pair of output transistors. By connecting the output signal to the second input terminal, negative feedback is developed to provide a unity-gain buffer. A number of special compensating circuits are provided to assure minimum distortion effects in the output signal.

19 Claims, 1 Drawing Sheet

WIDE-BAND TRANSCONDUCTANCE GENERATOR

BACKGROUND OF THE INVENTION

1. Field of the Invention

This invention relates to integrated circuit (IC) amplifiers useful as buffers. More particularly, this invention relates to circuits employ transconductance generators and arranged to provide wide bandwidth operation with excellent pulse fidelity and low distortion.

2. Description of the Prior Art

Transconductance is the ratio of the output current of a device to its applied input voltage, and often is designated $g_m$ (the inverse of resistance). Devices of this sort are used in many different kinds of applications. For example, variable transconductance devices are extensively used in analog multipliers, and also in specialized analog computing circuits such as shown for example in U.S. Pat. Nos. 4,475,169 and 4,476,538 (Gilbert). Cross-coupled quad circuits also have been known for some time, and have been used as transconductance amplifiers as shown in Gosser Patent No. 4,970,470.

Buffer amplifiers available in the prior art have had significant performance limitations, particularly with regard to bandwidth and both a-c and d-c gain precision. It is a principal purpose of this invention to provide amplifier circuitry in the form of a transconductance generator having important advantageous characteristics overcoming such limitations in the prior art.

SUMMARY OF THE INVENTION

In a preferred embodiment of the invention, to be described hereinbelow in detail, there is provided an amplifier useful as a unity gain buffer and having wide bandwidth, excellent gain accuracy together with d-c precision. This circuit realizes the attributes of traditional low-speed (DC) closed loop buffers as well as high-speed (wide bandwidth) open loop followers. The disclosed circuitry particularly is capable of operation with very low a-c distortion and high slew rates.

In more detail, the disclosed amplifier circuitry employs a cross-coupled quad circuit having first and second pairs of serially-connected complementary transistors. One input terminal of the amplifier is connected to a high-input-impedance level-shifting circuit having high and low outputs connected respectively to the bases of the first pair of quad transistors. A second input terminal of the amplifier is connected to input circuitry arranged identically, in that the terminal is connected through a second high-input-impedance level-shifting circuit having high and low outputs connected respectively to the bases of the second pair of quad transistors. The collectors of the two NPN quad transistors are connected to a first current mirror, and the collectors of the two PNP quad transistors are connected to a second current mirror. An output signal is taken from the collectors of the second pair of transistors and from the collectors of corresponding transistors in the current mirrors, and supplied in a pair of output transistors to an output terminal. Coupling this output signal to the second input terminal provides closed-loop feedback. The circuit thus realizes a unity-gain buffer having highly advantageous characteristics.

Distortion in the output signal is substantially minimized by several additional circuit arrangements. These arrangements reduce the effects of non-linearities due to the collector-to-base capacitances of the output transistors and the quad transistors, and also reduce the effects of non-linearities in the base currents of the output transistors.

Accordingly, it is an object of the invention to provide an improved transconductance generator. Other objects, aspects and advantages of the invention will be pointed out in, or apparent from, the following description of a preferred embodiment of the invention.

DESCRIPTION OF THE PREFERRED EMBODIMENT

Figure 1:
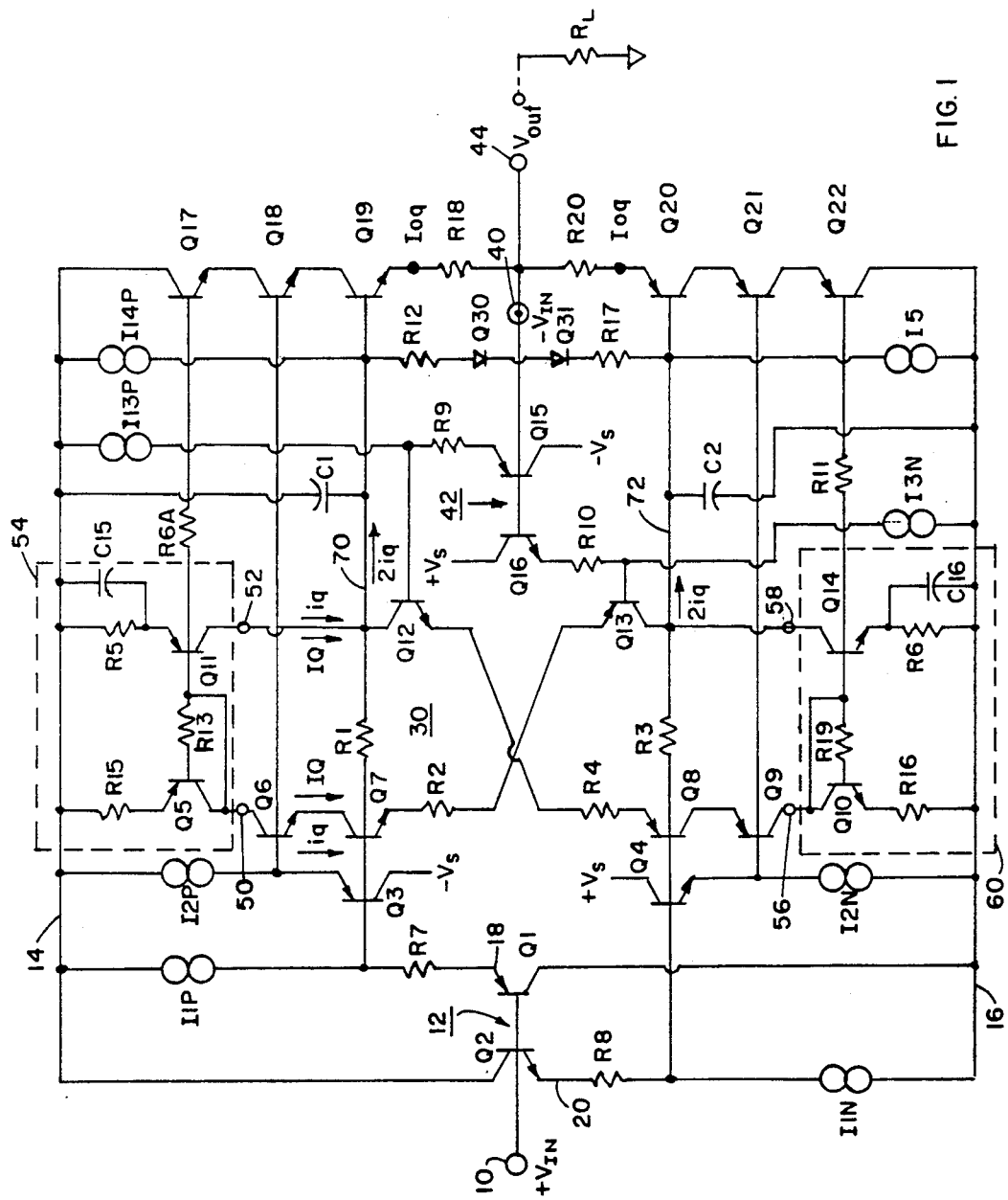
FIG. 1 is a schematic diagram showing the circuit arrangement of a preferred embodiment of the invention.

Referring now to the left-hand side of the drawing, there is a first amplifier input terminal 10 to which an a-c input signal may be applied. This is a positive input terminal and is connected to the input of a biasing circuit generally indicated at 12 and comprising a pair of complementary transistors Q1, Q2 having their bases connected together to serve as the input circuit. The collectors of these transistors are connected to plus and minus power leads 14, 16, e.g. ±5 V. The transistor emitters 18, 20 are connected through corresponding resistors R7, R8 to the respective bases of a first pair of complementary transistors Q7, Q8, to provide high and low level-shifted outputs to those bases.

This first pair of complementary transistors Q7, Q8 forms part of a cross-coupled quad generally indicated at 30 and including a second pair of complementary transistors Q12, Q13. The cross-coupling connections provide that the upper left-hand NPN transistor Q7 of the first pair is in series with the lower right-hand PNP transistor Q13 of the second pair, and the upper right-hand NPN transistor Q12 is in series with the lower left-hand PNP transistor Q8.

Near the right-hand edge of the circuit of FIG. 1, a second amplifier input terminal 40 is shown. This is a negative input terminal and is connected to a second biasing circuit generally indicated at 42. This biasing circuit is identical to the first biasing circuit 12 to provide symmetry for the two amplifier inputs. That is, this biasing circuit 42 comprises a pair of transistors Q15, Q16 having their bases connected together and to the second input terminal 40. The transistor collectors are connected respectively to the plus and minus power leads 14, 16. The emitters are connected through resistors R9 and R10 to the bases of the second pair of quad transistors Q12, Q13 respectively, to supply thereto high and low level-shifted signals corresponding to the signal supplied to the second input terminal 40.

In the embodiment disclosed herein, this second input terminal 40 is supplied through R18, R20 and output transistors Q19/Q20 with the output signal of the transconductance generator and mirror transistors. Thus, the input terminal 40 also is shown connected to the amplifier output terminal 44 since it furnishes the output signal as well.

The collectors of the upper (NPN) quad transistors Q7, Q12 are connected to terminals 50, 52 of a first current mirror generally indicated at 54. The connection to the left-hand terminal 50 is through a transistor Q6, the functioning of which will be described later. Similarly, the collectors of the lower (PNP) quad transistors Q8, Q13 are connected to terminals 56, 58 of a second current mirror 60, in an arrangement identical to that of the first current mirror.

In operation, if the differential input voltage ($V_{IN} - V_{OUT}$) is positive, quad transistors Q7 and Q13 will be driven harder, while the other quad transistors Q12, Q8 will be driven less. Thus, there will be an increase iq in the quiescent current Iq through transistors Q7, Q13. The current mirror 54 will reflect this increase in current iq into the outgoing current from its right-hand terminal 52.

The collector currents through the other quad transistors Q12, Q8, will decrease by iq, since they are driven correspondingly less than Q7, Q13 in the linear region. Thus there will be a net increase of 2iq in the current flowing to the right in the output lead 70 connected to the collector of Q12. Similarly, as a result of symmetry, there will be an increase of 2iq flowing to the right in the other output lead 72 connected to the collectors of transistors Q13 and Q14.

These two output currents of magnitude 2iq drive the bases of a pair of output transistors Q19, Q20, which act as buffers to provide the output signal of the transconductance circuitry amplifier to the output terminal 44. This output signal also is directed through the second input terminal 40 to the second biasing circuit 42 to serve as a negative feedback signal opposing that applied through the first input terminal 1,, thereby to cause the output signal to closely track the input signal. The difference between the two signals ($V_{IN} - V_{OUT}$) is extremely small, and serves as the error signal to activate the cross-coupled quad circuit 30 as described above. This a-c error signal (if resistors R1 and R3 are out) will be:

$$V_{IN} - V_{OUT}1 = K/G_m R_o$$

where
$G_m = 4/R_g$
$R_g = R2 + 2V_T/I_Q = R4 + 2V_T/I_Q$
$K \approx R_L/(R_L + \frac{1}{2}(R18 + V_T/I_{oq}))$
$R18 = R20$; $V_T = kT/q$
Ro (top) and Ro(bottom) are the open loop resistances seen at ports 70 and 72 respectively, where Ro = Ro (top) in parallel with Ro (bottom).

The transconductance generator described above includes further circuitry for significantly reducing distortion in the output signal. This distortion problem and the further circuitry provided now will be described.

The collector-to-base capacitance ($C_{cb}$) of the output transistor Q19 varies with voltage in a non-linear fashion, so that the displacement current through the capacitance would tend to vary non-linearly and thereby cause distortion in the output signal. (The functioning of the lower output transistor Q20 is the same, and the same corrective measures are used, so that no description of the latter will be included.) To avoid such distortion, Q18 has been added to the device.

This added transistor Q18 is connected in series with output transistor Q19 to force the collector voltage of Q19 to equal its base voltage, thus preventing the flow of any displacement current in the cross-quad Gm stage (30) and avoiding the distortion which otherwise would occur. In more detail, the base of Q18 is driven through Q3 and Q1, so that its base voltage will carry the input signal $V_{IN}$, but at a level $2V_{be}$'s above that of the input terminal 10. The base of Q19 also carries the input signal, but at a level just one $V_{be}$ above the input terminal. Because the emitter of Q18 is one $V_{be}$ below its base, and is connected to the collector of Q19, it will be seen that the collector voltage of Q19 will match its base voltage for both DC and AC operation, thus preventing the flow of displacement (capacitance) current, and thereby reducing distortion effects.

The base current of Q19 also has a non-linear component, and since that current flows into the cross-quad circuitry 30, it correspondingly reflects this distortion as a voltage non-linearity in the cross-quad transistors and associated resistors so as to correspondingly distort the output signal. Two feed-forward circuits are provided for avoiding such distortion, as will now be described (again, the description will be only of the top half of the circuitry, with the symmetrical bottom half functioning identically).

One feed-forward circuit comprises Q17, Q5 and Q11. In operation, the load current at the collector of Q19 is very nearly equal to that of Q17, and the base currents (the reflected load currents) are correspondingly very nearly the same. The base current of Q17 is servoed back to the base of Q19 through the mirror transistors Q5 and Q11, with the collector of Q11 connected directly to the base of Q19. Thus the base current (reflected load current) of Q19 is fed from the mirror transistor Q11 such that the base current non-linearities are first-order equal, thereby removing this distortion component from the cross-quad circuit 30. This cancellation arrangement provides an overall input-to-output distortion reduction by removing the effective non-linear base-reflected load current from the transconductance generator.

A second feed-forward path is provided through R1 which provides direct superposition of the input signal to the output via Q1 and Q19. This feed-forward action increases the loop gain of the buffer and thereby reduces the distortion characteristics of the device that would otherwise result.

With R1 >> R7 + Q1's emitter resistance, the input signal is 1:1 superimposed at node 70 (the high open loop Ro port). Neglecting finite Early voltages, this input signal is thus approximately 1:1 transferred to the output much like an open loop buffer. Prior to closed-loop correction, the open loop output signal would be:

$$V_{IN} \cdot (2R_L/(2R_L + 1/G_m + R18)) = V_{IN}(K)$$

$$G_m = I_{oq}/V_T.$$

The error signal ($V_{IN} - V_{IN} \cdot K$) when applied to the cross-quad circuit (i.e., with the feedback connected) is corrected such that the overall gain closely approaches 1. The transfer equation ($V_o/V_{IN}$) can be described as:

$$V_o/V_{IN} = (R_g + 2R1)/(2RN (1-K) + KR_g + 2R1)$$

where $1 << R_o$, and $RN = R7 + V_T/I1P$.

By reducing the ($V_{IN} - V_{OUT}$) error via R1, a further improvement in DC and AC linearity is achieved.

The collector-to-base capacitance of the upper left-hand cross-quad transistor Q7 also varies non-linearly with voltage, and thus tends to introduce distortion into the operation of the quad circuit. To minimize that effect, the transistor Q6 is connected in series with Q7 to perform the same function as Q18 does for Q19. That is, the base of Q6 is supplied with $V_{IN}$ at a level $2V_{be}$ above the input terminal 10, and the emitter of Q6 translates that signal to the collector of Q7 with a drop of one $V_{be}$. Thus the voltage on the collector of Q7 corresponds to that on the base of Q7, so that virtually no displacement current will flow. Thus, the effects of non-linear variations of $C_{cb}$ for Q7 are eliminated thus further improving the low distortion characteristics of the device. (The same circuit arrangement avoids such distortion from the lower-left quad transistor Q8.)

The collector-to base capacitance of the upper right-hand cross-quad transistor Q12 also varies non-linearly with signal level, and thus tends to introduce distortion into the output signal. Such distortion is effectively reduced by forcing the collector voltage of Q12 to track its base voltage, by virtue of the feedback through the biasing circuit 42. That is, the voltage on the base of Q12 comprises the output signal $V_{OUT}$ (which is essentially identical to the input signal $V_{IN}$) plus one $V_{be}$. Similarly, the collector voltage of Q12 is the input signal $V_{IN}$ plus one $V_{be}$ (due to Q1). Accordingly, the collector and base voltages essentially match, and the distortion which otherwise would occur is substantially eliminated. These distortion reduction techniques described allow for heavy load drive (i.e., 50 ohm transmission lines) with little change in distortion characteristics.

The gain of the overall buffer (including R1 and R3) can be described by the following equation:

$$V_o/V_{IN} \text{ (with } R1<<Ro) = (Rg+2R1)Rg/(KRg+2R1+2RN(1-k))$$

where
$RN = R7 + VT/I1P$; and
$R1 = R3$.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. A wide-band transconductance generator comprising:
   first and second pairs of complementary transistors each including base, emitter and collector;
   said first and second pairs of transistors being cross-coupled to provide a cross-quad circuit wherein one of said first pair is in series with a complementary one of said second pair, and the other of said first pair is in series with the other of said second pair;
   a first biasing circuit connected between d-c power leads and having an input circuit and two output circuits providing respective level-shifted outputs corresponding to a signal connected to the input circuit of said first biasing circuit;
   a first input terminal connected to the input circuit of said first biasing circuit to supply thereto an a-c signal;
   means connecting the two level-shifted outputs of said first biasing circuit to the bases of said first pair of transistors respectively;
   a second biasing circuit connected between d-c power leads and having an input circuit and two output circuits providing respective level-shifted outputs corresponding to a signal connected to the input circuit of said second biasing circuit;
   a second input terminal connected to the input circuit of said second biasing circuit to supply thereto an a-c signal;
   means connecting the two level-shifted outputs of said second biasing circuit to the bases of said second pair of transistors respectively; and
   output means coupled to two collectors of said first and second pairs of transistors to produce an output signal for the transconductance generator.

2. A transconductance generator as claimed in claim 1, including means for connecting said generator output signal to said input circuit of said second biasing circuit to provide a closed loop, substantially unity gain voltage follower.

3. A transconductance generator as claimed in claim 1, wherein said first biasing circuit comprises first and second transistors each having base, collector and emitter;
   said bases being connected together;
   said emitters being connected respectively to the bases of said first pair of transistors;
   said collectors being connected respectively to plus and minus power supply leads.

4. A transconductance generator as claimed in claim 3, wherein said second biasing circuit is the same as said first biasing circuit, to provide symmetry for the two input circuits.

5. A transconductance generator as claimed in claim 1, including first and second current mirrors each having two current terminals;
   the current terminals of said first current mirror being connected respectively to the collectors of said one transistor of said first pair and said one transistor of said second pair;
   the current terminals of said second current mirror being connected respectively to the collectors of the remaining two transistors of said first and second pairs of transistors.

6. A wide-band unity-gain buffer comprising:
   first and second pairs of complementary transistors each including base, emitter and collector;
   said first and second pairs of transistors being cross-coupled to create a cross-quad circuit wherein one of said first pair is in series with a complementary one of said second pair, and the other of said first pair is in series with the other of said second pair;
   a first input circuit connected to a first input terminal and supplying corresponding signals to the bases of said first pair of transistors respectively;
   a second input circuit connected to a second input terminal and supplying corresponding signals to the bases of said second pair of transistors respectively;
   output means coupled to two collectors of said first and second pairs of transistors to produce an output signal for the buffer; and
   means connecting said output signal to said second input terminal.

7. A low-distortion transconductance generator comprising:
   first and second pairs of complementary transistors each including base, emitter and collector;
   said first and second pairs of transistors being cross-coupled to develop a cross-quad circuit wherein one of said first pair is in series with a complementary one of said second pair, and the other of said first pair is in series with the other of said second pair;

a first input circuit connected to a first input terminal and supplying corresponding signals to the bases of said first pair of transistors respectively;

a second input circuit connected to a second input terminal and supplying corresponding signals to the bases of said second pair of transistors respectively;

output means comprising a pair of series-connected output transistors including base, emitter and collector, said output means being coupled to two collectors of said first and second pairs of transistors to produce an output signal for the transconductance generator;

a pair of compensating transistors each having base, emitter and collector, and each being connected in series with a corresponding one of said output transistors; and circuit means supplying corresponding control signals to the bases of said compensating transistors to reduce distortion in said output signal.

8. A transconductance generator as claimed in claim 7, wherein said circuit means comprises means coupling said bases to said first input terminal.

9. A transconductance generator as claimed in claim 7, wherein the emitters of said compensating transistors are connected to the collectors of said output transistors.

10. A transconductance generator as claimed in claim 8, including level-shifting means connected between said first input terminal and the bases of said compensating transistors and arranged to assure that the collector-to-base voltages of said output transistors are reduced to substantially zero.

11. A transconductance generator as claimed in claim 7, wherein said circuit means includes feed-forward circuits comprising first and second transistor means each coupled to the base of one of said compensating transistors and the base of a corresponding one of said output transistors;

each feed-forward circuit being arranged to reflect the base current of the compensating transistor back to the base of the corresponding output transistor so that the non-linear variations in the base current of said output transistor are isolated from said cross-quad circuit transistors.

12. A transconductance generator as claimed in claim 11, wherein each of said feed-forward transistor means comprises a current mirror coupled to a corresponding set of two of said two pairs of transistors of said cross-quad circuit.

13. A low-distortion transconductance generator comprising:

first and second pairs of complementary transistors each including base, emitter and collector;

said first and second pairs of transistors being cross-coupled to form a cross-quad circuit wherein one of said first pair is in series with a complementary one of said second pair, and the other of said first pair is in series with the other of said second pair;

a first input circuit connected to a first input terminal and supplying corresponding signals to the bases of said first pair of transistors respectively;

a second input circuit connected to a second input terminal and supplying corresponding signals to the bases of said second pair of transistors respectively;

output means comprising a pair of series-connected output transistors including base, emitter and collector, said output means being coupled to two collectors of said first and second pairs of transistors to produce an output signal for the transconductance generator;

a pair of compensating transistors each having base, emitter and collector, with each transistor being connected in series with a corresponding one of said cross-quad transistors; and circuit means coupled to said first input terminal and supplying corresponding control signals to the bases of said compensating transistors to reduce distortion in said output signal.

14. A transconductance generator as claimed in claim 13, wherein the emitters of said compensating transistors are connected to the collectors of said first pair of transistors respectively.

15. A transconductance generator as claimed in claim 14, including first and second current mirrors, each having two terminals;

one terminal of each mirror being connected to the collector of a corresponding compensating transistor;

the other terminal of each mirror being connected to the collector of a corresponding one of said second pair of cross-quad transistors.

16. A buffer as in claim 6 wherein:

said first input circuit comprises a biasing circuit including a pair of complementary transistors with their bases connected together and to said first input terminal; and said second input circuit comprises a biasing circuit including a pair of complementary transistors with their bases connected together and to said second input terminal.

17. A transconductance generator as claimed in claim 6, including first and second current mirrors each having two current terminals;

the current terminals of said first current mirror being connected respectively to the collectors of said one transistor of said first pair and said other transistor of said second pair;

the current terminals of said second current mirror being connected respectively to the collectors of the remaining two transistors of said first and second pairs of transistors.

18. A wide-band unity-gain buffer comprising:

first and second pairs of complementary transistors each including base, emitter and collector;

said first and second pairs of transistors being cross-coupled to create a cross-quad circuit wherein one of said first pair is in series with a complementary one of said second pair, and the other of said first pair is in series with the other of said second pair;

said cross-quad circuit further comprising first and second resistors;

said first resistor being connected between the base of said one of said first pair of transistors and the collector of said other of said second pair of transistors;

said second resistor being connected between the base of said other transistor of said first pair of transistors and the collector of said complementary one of said second pair of transistors;

a first input circuit connected to a first input terminal and supplying corresponding signals to the bases of said first pair of transistors respectively;

a second input circuit connected to a second input terminal and supplying corresponding signals to the bases of said second pair of transistors respectively;

output means coupled to two collectors of said first and second pairs of transistors to produce an output signal for the buffer; and means connecting said output signal to said second input terminal.

19. A buffer as in claim 18, wherein said resistors are equal-valued.

* * * * *